United States Patent [19]

Koomen et al.

[11] 4,126,900
[45] Nov. 21, 1978

[54] RANDOM ACCESS JUNCTION FIELD-EFFECT FLOATING GATE TRANSISTOR MEMORY

[75] Inventors: Joannes J. M. Koomen, Sunnyvale, Calif.; Jan Lohstroh, Eindhoven, Netherlands; Roelof H. W. Salters, Sunnyvale, Calif.; Adrianus T. Van Zanten, Eindhoven, Netherlands

[73] Assignee: U.S. Philips Corporation, New York, N.Y.

[21] Appl. No.: 814,643

[22] Filed: Jul. 11, 1977

[30] Foreign Application Priority Data

Jan. 28, 1977 [NL] Netherlands ............... 7700879

[51] Int. Cl.² ............................................. G11C 11/40
[52] U.S. Cl. ...................................... 365/185; 357/23
[58] Field of Search .................. 340/173 CA, 173 R; 357/23; 365/182, 184, 185

[56] References Cited

U.S. PATENT DOCUMENTS

| | | | |
|---|---|---|---|
| 3,814,992 | 6/1974 | Kump et al. ........................ | 357/23 |
| 3,906,296 | 9/1975 | Maserjian et al. ................ | 340/173 CA |
| 3,984,822 | 10/1976 | Simko et al. ..................... | 340/173 R |

OTHER PUBLICATIONS

Chang et al., Random-Access Junction Field-Effect Transistor Memory, IBM Technical Disclosure Bulletin, vol. 16, No. 1, 6/73, p. 255.

*Primary Examiner*—Stuart N. Hecker
*Attorney, Agent, or Firm*—Frank R. Trifari; Jack Oisher; Jerry A. Dinardo

[57] ABSTRACT

JFET memory structures, in particular for RAM's with non-destructive reading-out of the charge state of a floating gate electrode in which the primary selection is realized by means of capacitive coupling with the floating gate electrode. The secondary selection takes place on one of the main electrodes of the JFET structures in which the other main electrode can be connected to the supply. By means of a second common gate electrode the pinch-off voltage of the channels can be adjusted so that the channels are non-conductive in the non-selected condition and a good detection of the information state is obtained in the selected condition.

21 Claims, 9 Drawing Figures

RANDOM ACCESS JUNCTION FIELD-EFFECT FLOATING GATE TRANSISTOR MEMORY

The invention relates to a semiconductor device comprising several memory sites arranged in a matrix and each having a semiconductor zone of a first conductivity type extending in a region of the second, opposite conductivity type, said semiconductor zone serving to store information-representing charge, said stored charge being separated from the remaining part of the semiconductor body by a depletion layer present between the zone and the region, the depletion layer adjoining a channel region of a field effect transistor structure, the resistance to current passage through the channel region measured between two main electrodes, notably a source and drain region of the field effect transistor structure, being controllable by the information content of the memory site, a second depletion layer, by the thickness of which the said resistance can also be influenced, adjoining the channel region.

Such matrices of memory sites are known, for example, from "I.E.E.E. Journal of Solid State Circuits", Vol. SC-11, August 1976, pages 519 to 528 and ISSCC 73 "Digest of technical papers", pages 34, 35 and 195. In this case one-transistor-per-bit memories are concerned with a matrix of junction field effect transistors (JFET) with an annular gate electrode region and an electrically floating buried layer of the same conductivity type as the gate electrode region. The gate electrode region and the buried layer adjoin the channel region of the field effect transistor. As in the said second publication the main current paths of the field effect transistors may, each in series with a diode be arranged, at the crossings of a system of word and bit lines. The annular gate electrode regions are connected to write lines which are common to a row of the matrix. Each memory cell of the matrix comprises a diode and a field effect transistor with an annular gate electrode and a buried floating gate electrode and is connected to three selection or address lines which are common to a column or row, namely an address line which is common to a column and which is connected to the source electrode of the transistor, an address line which is common to a row and which is connected, via the diode, to the drain electrode of the transistor, and the write line which is common to a row and which is connected to the annular gate electrode of the transistor.

By applying a reverse voltage to the annular gate electrode relative to the source electrode in such manner that the associated depletion layer has such an extension that the *pn*-junction bounding the buried layer comes in the forward direction, charge carriers may be extracted from the buried layer in which the last-mentioned *pn*-junction, after the fall off of the reverse voltage at the annular gate electrode, is reversely biased. Conversely, charge carriers can be supplied again to the buried layer by switching the annular gate electrode in the forward direction so that charge carriers are injected in the channel region and are then collected by the buried layer. In this manner information can be written and erased. The stored information is read out with a current through the channel region of the transistor structure, the value of the passed current being a measure of the charge condition of the buried layer.

It is an object of the present invention to provide a similar integrated memory matrix which is particularly simple and compact in construction and it is based inter alia on the recognition of the fact that this can be achieved by suitably using a selection line which is situated on an insulating layer and which is coupled to a number of memory sites capacitively only.

A semiconductor device of the kind described in the preamble is characterized according to the invention in that the semiconductor zone is coupled capacitively to an access electrode which is common to a number of memory sites of the matrix and which is insulated from the semiconductor zone by an intermediate insulating layer.

In the semiconductor device according to the invention isolated access electrodes are used which usually will form the word lines and which are coupled capacitively to memory sites which are formed by semiconductor zones which are bounded by a *pn*-junction and which, except during writing or erasing information-representing charge, are electrically floating, that is have no direct electrically conductive connection. The electrically floating semiconductor zones are covered entirely by a closed insulating layer. For the word lines no contact with semiconductive zones or regions are necessary, at least within the matrix of memory cells, so that particularly little area is necessary at the semiconductor surface. In addition, besides the system of word lines only one further system of selection lines is necessary, the bit lines, which are connected to source or drain electrode regions of the field effect transistor structures.

All the main electrode regions of the field effect transistor structures of the matrix not connected to the selection lines are preferably connected together. The use of such a common electrode simplifies the electronics necessary for driving and controlling the matrix and the connection thereto.

In this connection, main electrode regions are to be understood to mean the source and drain regions of the field effect transistor structures which actually form the ends or connections of the main current path of said structure and are the main electrodes. In addition, the field effect transistors have one or more control electrodes or gate electrodes.

The main electrode regions not connected to the bit or selection lines are advantageously constructed as and are associated with the same continuous semiconductor region of the second conductivity type. In that case, no contacts, and hence no contact windows, are necessary for said regions within the matrix. This absence of contacts also contributes to the compact structure of the matrix.

The drain electrode regions of the JFET structures are preferably interconnected. In that case the JFET structures are connected as source followers in which the common drain electrode connection can be connected to the supply.

In an important preferred embodiment of the semiconductor device according to the invention the second depletion layer is associated with a second gate electrode which is preferably constructed so as to be common to all JFET structures of the matrix. As will be explained hereinafter, such a second gate electrode may be used for adjusting the pinch-off voltage at a suitable value. This is of importance, inter alia, in connection with the detection of the stored information during reading-out.

The common second gate electrode may advantageously be formed by a common substrate region of the first conductivity type extending below the channel regions of all JFET structures of the matrix. In this case the semiconductor structure of the matrix is particularly simple and compact.

In a further preferred embodiment of the semiconductor device according to the invention the access electrodes are provided in a self-registering manner between the source and drain electrode regions and above the semiconductor zones of the first conductivity type. The access electrodes are preferably straight stripes of semiconductor material and the JFET structures situated one behind the other in the direction of an access electrode are separated from each other by means of a form of dielectric isolation, for example air isolation, V grooves or sunken or inset oxide.

In a further important embodiment of the semiconductor device according to the invention no buried layers are necessary for the realization of the JFET structures and the growth of an epitaxial layer during manufacture can be avoided. As a result of this, the efficiency of manufacture can be comparatively high. In this preferred embodiment, at least the channel regions of the JFET structures, the semiconductor zones of the first conductivity type, and the main electrode regions have been obtained by overdoping.

Advantageously, during erasing information from a memory site an erasing pulse is used of a first polarity on the access electrode, in which a potential is impressed on the semiconductor zone of the first conductivity type coupled capacitively thereto at which punch-through between said semiconductor zone and a source or supply of free charge carriers associated with the first conductivity type occurs. By means of a write pulse of the second polarity opposite to the first and an information signal at one of the main electrode regions of the JFET structure, the semiconductor zone of the first conductivity is brought at a potential by injection of charge carriers at which the pn-junction between said zone and the channel region of the JFET structure is reversely biased in such manner that the channel region is pinched-off at least in the non-selected condition of the memory site. The read pulse on the access electrode preferably has the same polarity as the write pulse and an amplitude such that the measured current through the channel of the selected JFET structure corresponds to the charge state or information content of the semiconductor zone of the first conductivity type.

The JFET structures are preferably integrated together with electronic means which are coupled to the access electrodes and to the selection lines in a common semiconductor body, the control means comprising at least means for selectively writing and reading the memory sites.

The invention will be described in greater detail with reference to an embodiment and the accompanying drawing, in which FIG. 1 is a diagrammatic plan view of a part of a semiconductor device according to the invention, and FIGS. 2, 3 and 4 are diagrammatic cross-sectional views of said part of the semiconductor device taken on the lines II—II, III—III and IV—IV, respectively, of FIG. 1.

Figure 1:
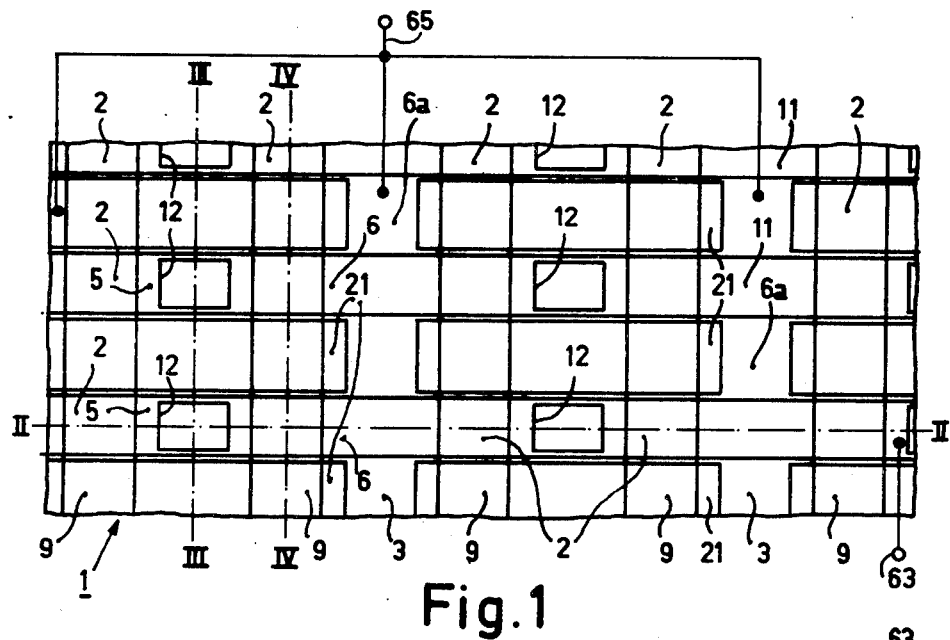

The embodiment relates to a random access memory (RAM). This device comprises a semiconductor body 1 having several memory sites arranged in a matrix in which information can be written, stored and/or erased and in which the information content of each memory site can be read-out. The part of the semiconductor body 1 shown in FIGS. 1 to 4 has a number of semiconductor zones 2 of a first conductivity type which are separated from each other and which extend in a region 3 of the second conductivity type. In the example a continuous n-type silicon layer 3 is used in which the p-type zones 2 are situated. The p-type zones 2 serve to store information-representing charge, the stored charge being separated from the remaining part of the semiconductor body 1 by the depletion regions associated with the pn-junctions 4. Said depletion regions each adjoin a part of the region 3 which forms the channel region of a junction field effect transistor structure. The p-type zones 2 extend as gate electrodes between source and drain regions 5 and 6, respectively, of the JFET structures. The source and drain regions 5 and 6 form the main electrodes or main electrode regions of the field effect transistors which are internally connected together by the channel region. The resistance for current passage through the channel region measured between the main electrodes inter alia depends on and is controllable with the thickness of the depletion region associated with the pn-junction 4.

A second depletion region associated with the pn-junction 7 formed between the n-type layer 3 and a p-type substrate region 8 still adjoins each channel region. The thickness of said depletion region also influences the resistance for current passage or current flow through the channel region.

The p-type zones 2 are arranged in a matrix which in the present example is two-dimensional and consists of a number of rows and columns. The semiconductor zones 2 situated in the same column are coupled capacitively to a common access electrode 9 which is separated from the semiconductor zones 2 by an insulating layer 10. The access electrodes 9 form the word lines of the random access memory which belong to the primary selection.

In the direction of the rows selection lines also extend, namely the bit lines 11 (secondary selection). The bit lines 11 are connected to one of the main electrodes, for example, to the source electrode regions 5 of the JFET structures, via apertures 12. Otherwise the bit lines are separated from the semiconductor body 1 and the word lines 9 by the insulating layer 13.

The memory thus has a pattern of word lines 9 and bit lines 11 in which at the crossings of said lines a JFET structure is present whose source electrode region 5 is connected to the relevant bit line 11 and in which the relevant word line 9 is coupled capacitively to a semiconductor zone 2 which serves as a memory site and which is incorporated in the JFET structure as a gate electrode. The drain electrode regions 6 of the JFET structures are all connected together and form part of the same continuous semiconductor region 6, 6a. Said semiconductor region 6, 6a comprises stripe-shaped parts 6a extending parallel to the rows and the word lines 9. The functions of the main electrode regions 5 and 6 may also be changed, the region 6, 6a being connected as a common source electrode and the regions 5 being connected as drain electrodes.

The JFET structures of the matrix are divided over a number of groups, each group having a common selection or bit line 11 which is connected to the source electrode regions 5. All the JFET structures of the same group belong to different words. The number of word lines or access electrodes 9 thus is at least equally large as the number of JFET structures which belongs to the group having a common bit line 11, in which said minimum number of word lines is also sufficient.

The second gate electrode 8 is constructed so as to be common to all JFET structures of the matrix. The gate electrode 8 is a common p-type substrate region which extends below the channel regions of all the JFET structures of the matrix.

Figure 5:
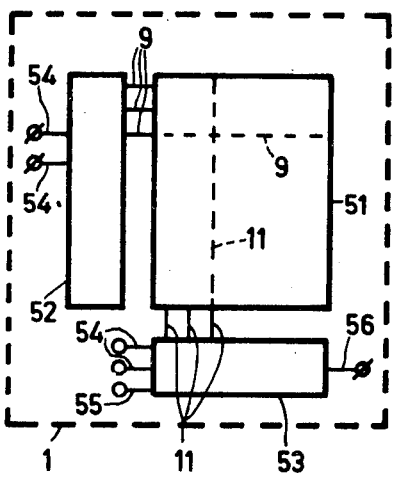
FIG. 5 shows diagrammatically the structure of a larger part of the device.

In addition to the matrix 51 of memory cells (FIG. 5), the semiconductor body 1 also comprises control logic and read-out electronics which are shown diagrammatically by the blocks 52 and 53. Known circuit arrangements may be used for this purpose. The block 52 comprises, for example, a number of address inputs 54 and a decoder with which a word line 9 is assigned with reference to the presented address. Furthermore, means are present in said block 52 for applying suitable signals to the word lines 9 for reading, writing, erasing and storing information in the memory matrix. The block 53 likewise comprises means to derive or apply suitable signals for said functions to or from the bit lines 11. In addition to at least one signal input 55 and at least one signal output 56, address inputs 54 may also be present.

Since the organization and construction of the periphery of the matrix, hence, for example, inter alia of the control logic, may be constructed in many manners which are not so relevant within the scope of the present invention, this will not be further described. The random access memory (RAM) may be word-organized or bit-organized and be integrated with the control electronics in the same semiconductor body, for example, as a part of a larger assembly which comprises still further memories and/or logic.

Figure 6:
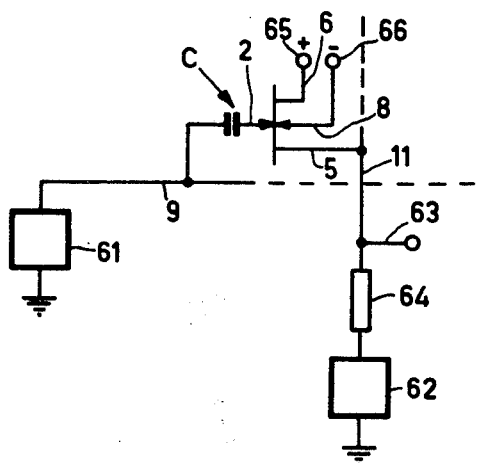
FIG. 6 shows diagrammatically an electrical equivalent circuit diagram of a memory cell of the device.

The present invention relates in the first instance to the memory matrix 51 itself and more in particular to the construction of the memory cells from which said matrix is constructed. FIG. 6 shows diagrammatically an equivalent circuit diagram having a word line 9 and a bit line 11 and a memory cell at the crossing thereof which is shown as a junction field effect transistor having a source electrode 5, a drain electrode 6, a first gate electrode or memory site 2 which is coupled to the word line 9 via a capacitance C and a second gate electrode 8 which is formed by the common substrate.

It is furthermore shown that the word line 9 is connected to means 61 for the driving and control thereof. The bit line 11 is also connected to means 62 for driving and controlling. Shown diagrammatically is furthermore an output 63, a resistor 64 being incorporated between the output 63 and the driving and control means 62. If desired an (electronic) switch may be used parallel to or instead of the resistor 64, which switch is closed when a voltage is to be impressed upon the bit line 11 and is opened when the information on the bit line in the form of a current is read-out via the output 63.

The voltages to be applied to the word lines and bit lines may be expressed with respect to a given reference level or zero level for which earth potential is chosen in the present example, as is shown. The other voltages to be mentioned hereinafter are also expressed with respect to said reference level.

The voltages to be used during operation will depend inter alia on the punch-through voltage between the semiconductor zones 2 and the substrate 8. Said voltage depends on the thickness and the doping of the semiconductor region 3. The punch-through voltage may be, for example, approximately 10 Volts. The drain electrode regions 6 may be connected to a supply voltage source of, for example, +5 to +10 Volts. The supply voltage is chosen larger or at least equal to the highest voltage which may appear on the bit lines so that the main electrodes of the JFET structures during operation cannot mutually change functions. Furthermore, a voltage of approximately −2 Volts is applied, for example, to the common substrate. The connection 65 for the supply is shown diagrammatically also in FIGS. 1 and 2. In these Figures an output 63 is also shown diagrammatically for one of the bit lines 11 and in FIG. 2 the connection 66 for the common substrate is shown diagrammatically.

Figure 7:
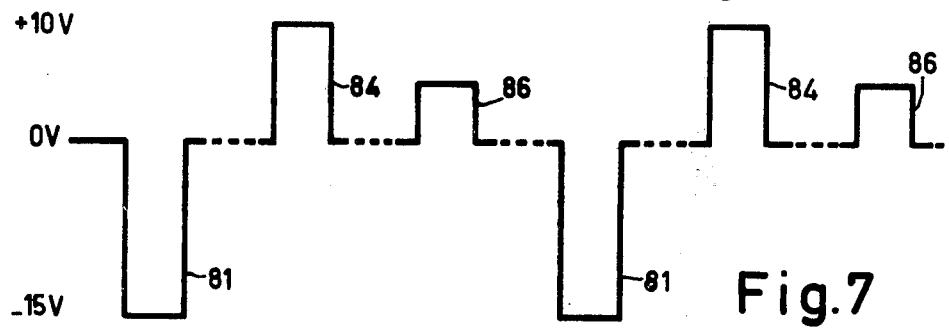
FIGS. 7, 8 and 9 show diagrammatically operating voltages which can occur at the word lines and at the bit lines and at the floating gate electrodes or memory sites, respectively.
Figure 8:
Figure 9:
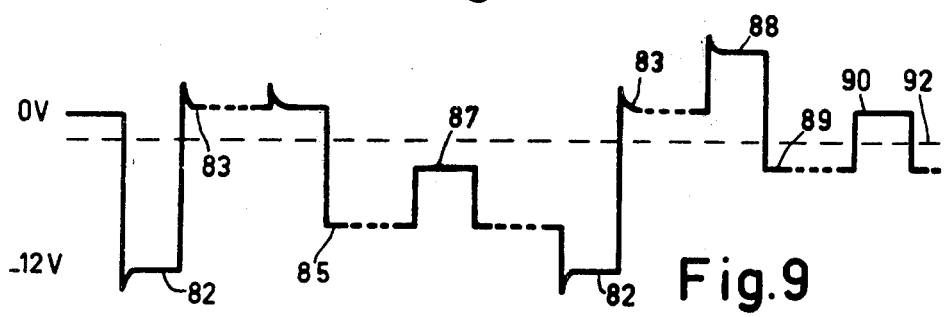

In the non-selected or quiescent state a voltage of 0 Volt is applied to the word lines and bit lines 9 and 11. FIG. 7 shows the voltage levels which can be impressed upon the word line 9 at various instants for the various functions or operations such as erasing, writing and reading. FIG. 8 shows the voltage levels at corresponding instants on the bit line 11 and FIG. 9 shows diagrammatically the associated voltages on the semiconductor zone 2.

A voltage pulse 81 of approximately −15 Volts can be applied to a selected word line 9 or to all word lines simultaneously or successively, all bit lines being kept at 0 Volts. Due to the capacitive coupling represented by the capacitance C the semiconductor zones 2 coupled to the word line want to follow the voltage at the word line. However, the punch-through voltage will be exceeded, so that charge carriers, in this case holes, flow from the substrate to the semiconductor zones 2. The voltage at the semiconductor zones 2 will differ 10 Volts from that of the substrate 8 and will hence be approximately −12 Volts, as denoted at 82.

If the voltage at the word line 9 is then reduced to 0 Volt, the voltage at the semiconductor zones 2 follows until the pn-junctions 4 between said zones and in particular the source electrode regions 5 connected to the bit lines 11 come in the forward direction. As a result of this, charge carriers (holes) are injected in the region and drained away via the bit lines and/or collected by the substrate. The voltage at the collector zones 2 will reach a value of a diffusion voltage or threshold voltage $V_j$ above the bit line voltage, so that just no injection of charge carriers occurs anymore. Said threshold or junction voltage $V_j$ for Si is, for example, 0.6 to 0.7 Volt. The semiconductor zones 2 are now charged to a reference voltage denoted at 83 and all information previously present, if any, is erased.

The reference voltage impressed upon the semiconductor zones 2 in this manner is less suitable for use as an information signal because at these voltages the channels of the JFET structures are opened and hence current will flow through the channels to the bit lines. Therefore, a voltage pulse 84 of approximately +10 Volts is then applied to the selected word line. Excessive charge carriers again flow from the semiconductor zones 2 and after termination of the voltage pulse at the word line the voltage at the semiconductor zones 2 will be approximately $(-10 + V_j)$ Volts as denoted at 85, provided the voltage at the bit line has remained 0 Volt unvaried. The value of the write voltage pulse 84 of 10

Volts at the word line is chosen to be so that the resulting voltage of $(-10 + V_j)$ Volts at the semiconductor zone 2 is sufficient to keep the channel of the JFET pinched off both at the voltages applied in the non-selected state and at the voltages applied to the word lines for reading out. The said pinch-off voltage in the present example will be approximately $-2.5$ to $-3$ Volts. On the negative side the voltage at the semiconductor zones 2 is limited by the fact that it is to be prevented that after the termination of the write pulse the charge state or charge condition of the semiconductor zones 2 is changed due to the occurrence of punch-through to the substrate 8. From this follows a maximum permissible value for the write pulse 84.

The charge state of the semiconductor zones 2 thus written is suitable for use as a zero level for the information to be represented. When binary logic information is used, said level will represent, for example, the logic 0.

It is to be noted that the second gate electrode formed by the substrate 8 in the above description has served only as a source or store of charge carriers. It is hence not necessary for the second gate electrode to be constructed as a substrate and to extend below the channel region. It is sufficient when in the proximity of each semiconductor zone 2 a source or store of charge carriers of the same type as forms the majority in the zone 2 and separated from said zone is present which during erasing is temporarily connected to the semiconductor zone 2 so as to supply the required charge carriers and which preferably but not necessarily can also take up afterwards charge carriers injected by the zone 2.

During writing and during the time between erasing and writing at least all the channels of the JFET structures of the selected word line are opened and current can hence flow through said channels. If and insofar as this is undesired, the connection between the drain electrode regions 6 and the supply voltage source can be interrupted during said period or periods. The drain electrode regions 6 during said period may also be applied to a lower positive voltage or to a voltage of 0 Volt. After writing, the supply voltage of $+5$ to $+10$ Volts is connected again.

FIG. 7 subsequently shows a read pulse 86 the voltage of which is, for example, approximately $+5$ Volts. FIG. 9 shows that the voltage at the semiconductor zone 2 follows to the level 87 which will be approximately $(-5 + V_j)$ Volts. The read pulse, at least when logic binary information is used, hence zeroes and ones, is chosen to be so that in this case the channel of the selected JFET structure remains closed. Hence the voltage level 87 is more negative than the pinch-off voltage which in this example is approximately $-2.5$ Volts.

When analog information is used, the read pulse 86 will preferably be chosen to be so that the level 87 is equal to the pinch-off voltage so that just no current flows through the channel or so that a very small current through the channel is measured. For the information to be read-out, that is for the read signal on the bit line, the zero level thus corresponds to no or a very small current.

Besides the lowest information level, it must also be possible to write and read-out a highest information level which can inter alia represent the logic 1. FIG. 7 shows for this purpose another erasing pulse 81, a write pulse 84 and a read pulse 86.

During erasing the voltage at the semiconductor zone 2 again changes via the level 82 to the level 83. The write pulse 84 in this case coincides at least partly with an electrical information signal 187 of, for example, approximately $+5$ V presented on the bit line, the information signal to be written on the bit line being maintained at least until the write pulse has terminated. The voltage at the semiconductor zone 2 now follows during the write pulse 84 to the level of approximately $(+5 + V_j)$ Volts. After termination of the write pulse 84 the voltage 89 at the semiconductor zone 2 is approximately $(-5 + V_j)$ Volts. The value of the largest information signal 187 to be presented is preferably chosen to be so that the level 89 is at least equal to the pinch-off voltage so that the channel of the JFET structure with each written information content is pinched-off in the non-selected state. The written information content corresponds to the electrical signal presented on the bit line which can assume all values between the lowest and the highest level. So the memory may be used for binary operation and for analog operation.

With a subsequent read pulse 86 or $+5$ Volts, the voltage at the semiconductor zone 2 follows approximately to the level 90 of $+V_j$ Volts. The channel of the JFET structure now is open and a current will flow through the bit line and/or a voltage variation will occur at the bit line so that a pulse 91 can be detected at the output 63. The voltage level 90 is such that with maximum information content in the selected state the semiconductor zone 2 preferably does not come in a state in which charge carriers are injected. The charge condition of the semiconductor zone 2 does thus not change and the information is retained. Reading-out occurs non-destructively. One of the advantages of this is that, if, in contrast with what is shown diagrammatically in FIG. 6, upon detection in otherwise known manner the current flowing in the bit line is integrated, the output signal can be adapted to the desired value within wide limits by choosing a matching length or duration for the read pulse 86. Also when the stored information-representing charge quantities are very small a readily detectable output signal can thus nevertheless be obtained. The charge storage capacitance C of the semiconductor zones 2 may thus be comparatively small.

It is to be noted that in the above description the influence of stray capacitances, for example the capacitances between the first gate electrode and the adjoining source and drain regions which are coupled to the depletion region which keeps the information content of the semiconductor zone 2 separated from the remaining part of the semiconductor body 1, have been neglected with respect to the capacitance C. In practice, various voltage levels will be slightly influenced in that a voltage division occurs to a small extent across the capacitance C and stray or parasitic capacitances connected in series therewith.

It is shown in FIGS. 7, 8 and 9 by broken lines between the various pulses that the sequence and the time duration between the pulses may be different from what has been described. Notably, between two writing operations several read-out operations may be carried out because actually reading-out is non-destructive. What will occur indeed is that the charge stored in the semiconductor zone 2 will leak away in the long run, for example, by generation of charge carriers in the depletion layer. Both the lowest information level 85 and the highest information level 89 will shift in a positive direction as a result of leakage currents. For the lowest or logic 0-level this means that the level 87 during the read-pulse might come above the pinch-off voltage and undesired channel current might be measured. For the highest or logic 1-level this means that the level 89 can rise above the pinch-off voltage so that channel current can also flow in the non-selected condition. Thus, in practice, the level 89 will be laid at a sufficient distance from the pinch-off voltage to prevent that in the desired storage time the channel can be opened by leakage. Another result of leakage might be that the level 90 threatens to rise above $+V_j$ Volts. During the read pulse 86 charge carriers are injected from the semiconductor zone 2 so that the level 90 is maintained. After termination of the read-pulse 86 the information level 89 is restored to the original value of $(-5 + V_j)$ Volts. However, such a restoring of level occurs only at the logic 1-level and not at the logic 0-level.

In connection with the above it may therefore be necessary for information which is to be stored for a long time to regularly rewrite the desired information in the mean time. It will often be possible to choose the instants at which rewriting occurs in such manner as to fall in periods in which there is no need of reading-out stored information. Erasing, writing and reading occurs word by word. For a bit-organized memory a selection possibility for the individual bits will thus be incorporated in the block 53.

It is furthermore of importance that the voltages occurring at the bit lines are at most $V_j$ Volts lower than the voltages of the semiconductor zones 2 in the non-selected words so that the information stored in said words is not influenced. At these voltages, as a matter of fact, the pn-junctions between the semiconductor zones 2 and the source electrode regions 5 are in the cut-off state or are at least not in the injecting state. Furthermore, in the non-selected words, hence words with a word line voltage of 0 Volt, all channels are pinched-off so that no influencing of the bit-lines is possible via said channels. Substantially no current will flow either from the second gate electrode 8 to the bit lines so long as the voltages occurring at the bit lines are always larger or at most $V_j$ Volts lower than the voltage of said second gate electrode.

As already stated, the stored quantities of charge may be comparatively small because said quantities are not readout themselves as is the case, for example, in the known 1 MOST-per-bit-memories. This is used in the present invention to arrive at a very compact component or memory cell which is particularly suitable, for example, for very large memories having 16K or more memory sites.

In particular the application of only capacitive coupling between the memory sites present in the semiconductor body and the isolated access electrodes or word lines provided on the body enables a compact structure with comparatively small memory sites. By avoiding direct contact with the semiconductor regions serving as memory sites, no contact apertures for said semiconductor regions are necessary. Above the semiconductor zones 2 the insulating layer 10 is closed entirely. Furthermore, the capacitive coupling with an insulating layer 10 as a dielectric medium results in a favourable ratio between the memory capacitance C and the stray capacitances, in which such a memory capacitance C in addition shows little leakage. The semiconductor zone 2 forming the memory site may be restricted to a very small zone which is covered entirely or substantially entirely by the word line.

Therefore, the memory site is preferably formed, as in the embodiment, by a surface zone 2 of a conductivity type opposite to that of the adjoining part 3 of the semiconductor body 1.

Another favourable property of the matrix of memory sites according to the invention is that with a 2-dimensional arrangement in rows and columns, besides one set of access electrodes or word lines in one direction, only one set of selection or bit lines is necessary in the other direction transverse to the one direction. Although the JFET structures have a third connection for the supply, this can easily be constructed so as to be common to all structures and located in the semiconductor body 1. This common main electrode might be constructed as a common n-type substrate, for example, with a second gate electrode in the form of a p-type epitaxial layer or buried layer which, at the area of the ends of the channels of the JFET structures, is provided with apertures or interruptions through which the n-type channels are connected to the n-type substrate. The n-type channels then form part, for example, of an n-type epitaxial layer which has been grown after providing the p-type second gate electrode. The second gate electrode may be connected in a suitable place, for example, at the edge of the matrix, by means of a deep p-type contact zone extending from the surface. Preferably, however, the common main electrode is constructed as a surface region having stripes 6a extending substantially parallel to the access electrodes or word lines. This common main electrode may be provided with an electrically conductive connection, not shown, at the edge of the matrix. Preferably, but not necessarily, the common main electrode forms the drain electrodes of the JFET structures so that said JFET structures are arranged as source followers.

So within the matrix only one type of contact apertures is necessary, namely the apertures 12 for the connection of the bit lines 11 to the source electrode regions 5. As a result of this the number of contact apertures per memory cell can easily be reduced to the value 0.5. This low value is also particularly favourable to arrive at a compact memory matrix.

The JFET structures which in a direction parallel to the access electrodes or word lines are situated one behind the other are preferably separated from each other by using a form of dielectric isolation, for example air isolation, V-grooves or grooves filled with insulating material. Dielectrical isolation in this direction has the important advantage that the memory sites or semiconductor zones 2 need not be provided annularly or otherwise with closed geometry around the associated source electrode region. By means of dielectric isolation the channel regions can simply be limited to below small semiconductor zones which nevertheless completely control the channel currents. The access electrodes or word lines 9 in this case can be constructed as substantially straight stripes and in a self-aligned manner between the source and drain electrode regions 5 and 6 and above the memory sites or semiconductor zones 2.

The access electrodes or word lines 9 are advantageously constructed as self-aligned stripes of semiconductor material on the insulating layer and the dielectrical isolation is obtained by means of stripes 21 (FIGS. 1 to 4) extending transversely to the access electrodes or word lines 9 and being sunk in the semiconductor body 1 at least over a part of their thickness. The isolating stripes 21 preferably extend down to the substrate 8. If necessary, a channel stopper (not shown) may be provided below the isolating stripes 21. It is alternatively possible to use isolating stripes which, for example, extend at least down to a depth which is larger than the depth of penetration of the semiconductor zones 2 and which adjoin p-type zones or regions which are situated below the isolating stripes and which form one assembly of p-type material with the substrate. The isolating stripes preferably consist substantially entirely of insulating material and have been obtained by local oxidation of the semiconductor body. For a manner in which the above-described modified embodiments can be obtained, is referred to the U.S. Pat. No. 3,783,047, which is hereby incorporated by reference.

In the example, the n-type region 3 (FIGS. 1 to 4) forms a grating or grid having apertures which are occupied by the insulating stripes 21. The n-type grating consists of parallel extending stripes 6a which in the transverse direction are connected together at regular distances. The transverse connections each provide space for two JFET structures having a common source electrode region 5 in the centre of the transverse connection, which region is enclosed on oppositely located sides between two word lines 9 with memory sites 2 situated therebelow. This embodiment enables the manufacture of very small structures and to use for its manufacture manufacturing methods which have already been tested in practice. Both the smallness of surface and the use of manufacturing methods which are already in use for other products favourably affect the yield of the manufacture and hence also the cost-price.

It is of importance also in connection with the manufacture and the cost-price that, when using the invention, buried layers are not necessary and the growth of epitaxial layers can be avoided. The device according to the invention therefore preferably has a common layer-shaped region 3 which has been obtained by a doping treatment, for example by implantation and/or diffusion of activators in a substrate region 8 of the opposite conductivity type. In that case the region 3 has thus been obtained by overdoping from the surface of a substrate region. The doping is then preferably provided by ion implantation.

Furthermore, the semiconductor zones 2 have advantageously been obtained as parts of a p-type surface layer provided by implantation of activators in the layer-shaped n-type region 3 which has the geometry of a grating, which parts are separated from each other and adjoin the semiconductor surface. The p-type surface layer originally provided as a continuous assembly is preferably subdivided into semiconductor zones 2 which are separated from each other by a doping treatment in which the word lines have served as a mask and in which the more highly doped n-type source and drain electrode regions 5, 6 and 6a have been obtained. In connection herewith the said more highly doped electrode regions preferably have a depth of penetration which exceeds the depth of penetration of the p-type semiconductor zones 2.

Opposite to the first gate electrode 2 the second gate electrode preferably adjoins the same part of the channel region of the JFET structure. In that case the second gate electrode may be used for adjusting the pinch-off voltage of the JFET structure at a suitable value. This adjustment can be realized so as to be common to all JFET structures of the matrix. The second gate electrodes are hence preferably interconnected, a favourable construction being that in which the second gate electrodes are formed by a common gate electrode 8 extending below all channel regions and memory sites 2 of the matrix. Said common gate electrode may be a conductive layer separated from the semiconductor region by an insulating layer or, as in the example may be constructed as a common substrate region 8 which may simultaneously form the source or store of charge carriers required for the memory.

The incorporation of the possibility of adjusting the pinch-off voltage has advantages inter alia in connection with the punch-through voltage and the use thereof in the memory.

In connection with, for example, the area of the semiconductor body necessary for the memory, the required source of charge carriers is preferably not provided at the semiconductor surface on the upper side of the channel region but at the lower side of the channel region and opposite to the first gate electrode 2. In that case, the punch-through voltage of the first gate electrode 2 to the source of charge carriers will usually not be much larger than the pinch-off voltage which is necessary to pinch-off the channel region of the JFET structure with the depletion layer associated with the semiconductor zone 2. Nevertheless it is of importance for the desired operation that said channel region can be pinched-off without the information content of the semiconductor zone 2 changing, in other words without the punch-through voltage being exceeded. In the example there was started from a punch-through voltage of approximately 10 Volts. The pinch-off voltage then is slightly lower and is, for example, approximately −9 Volts. Said difference of 1 Volt may be too small for a reliable operation, in particular if during the manufacture some spreading in layer thicknesses and/or doping concentrations occurs. When, however, the channel region is slightly squeezed from the oppositely located or lower side by means of the second gate electrode 8, then the voltage which is still necessary at the first gate electrode to entirely pinch-off the channel region will be considerably smaller. Since the thickness of a depletion layer is to a first approximation approximately proportional to the root from the reverse voltage occurring across the depletion layer, the pinch-off voltage of the JFET structures will have been reduced from approximately 9 Volts to 2 to 3 Volts at a voltage of 2 Volts across the pn-junction 7 as in the example.

When binary information is used, the adjustment of the pinch-off voltage and the value of the read pulse 86 can also be easily matched to each other so that the resulting pinch-off voltage lies favourably between the voltage levels 87 and 90, so that a good discrimination is obtained between the zeros and the ones. In FIG. 9 the level of the selected pinch-off voltage is denoted by the broken line 92. This level lies approximately centrally between the level 87 of the logic 0 and the level 90 of the logic 1.

The charge carriers to be supplied to the semiconductor zones 2 upon erasing information could also be obtained by generation of charge carriers in the n-type region as a result of absorption of radiation. However, this is not a very attractive method for a semiconductor memory. In general, erasing can be better done entirely electrically in which in the semiconductor body a source or store of the required charge carriers is available which can be reached by punch-through from the semiconductor zones 2, the semiconductor device being preferably assembled in a conventional optically closed envelope. An optically closed envelope is to be understood to mean in this connection an envelope which is substantially impervious to at least the radiation in the wave-length range for which the semiconductor body is sensitive and which radiation is absorbed therein while generating charge carriers.

The embodiment described in a random access memory (RAM) having a system of word lines and bit lines 9 and 11, respectively, which cross each other and which at the crossings are coupled to semiconductor memory cells comprising junction field effect transistor structures. Each JFET structure has first (5) and second (6) main electrodes and an intermediate channel region in which a first gate electrode 2 and a source of charge carriers 8, preferably combined with a second gate electrode, adjoin the channel region and are separated from the channel region by barriers, and in which the potentials at the gate electrodes control the conductivity in the channel. One of the gate electrodes of each JFET structure has a floating potential the value of which can represent an information signal under the control of write and erasing voltages which can be applied to selected word lines and bit lines. Means are furthermore present to erase information which is stored in the JFET structures and means to write information in a selected cell. The erasing means comprise means for applying voltages to selected word lines so as to cause punch-through between the first floating gate electrode and the source of charge carriers, and the writing means comprise means to apply voltages to selected word lines and bit lines in which injection of charge carriers occurs of the first floating gate electrode in the channel of a selected memory cell. The word lines are each coupled capacitively to the first floating gate electrodes of a row or column JFET structures.

The memory matrix is integrated in a common semiconductor body together with control means (logic).

The word lines are coupled capacitively to the memory cells only. Therefore, the direct voltage level of the voltage at the word lines does not influence the operation of the memory cell, at least within wide limits. This provides a great degree of freedom in designing the peripheral electronics for the memory. If desired, bipolar techniques may be used in the peripheral electronics. The peripheral electronics, including the control means, are preferably realized in MOST technique.

In connection with the required peripheral electronics, as well as the realizable speeds in reading, writing and erasing, it is still of importance that the required voltage pattern on the word lines and bit lines should be comparatively simple. Voltage variations occur only at the selected word lines and bit lines in which the information content in the non-selected and the half-selected cells remains uninfluenced, without it being necessary for the voltages at the non-selected lines to be varied, in which in addition the channels of the JFET structures of the non-selected and the half-selected cells remain substantially pinched-off.

As shown in FIG. 7, the voltage level or the amplitude of the write pulse 84 preferably is larger than the voltage level or the amplitude of the read pulse 86. However, this is not necessary. When the voltage levels at the bit line which represent the logic 0 and the logic 1, respectively, are adapted, the write pulse can be reduced. If, for example, the level 93 in FIG. 8 is reduced to approximately −2.5 Volts and the level 87 is set up, for example, at 0 Volt, a write pulse 84 of +5 Volts which is as large as the read pulse 86 will suffice. The level 85 then becomes approximately −7.5 Volts, while the level 87 will be at approximately −2.5 Volts. The level 88 will become equal to the level 83, while the levels 89 and 90 remain unchanged. The pinch-off voltage is adjusted between −2.5 Volts and $+V_j$ Volts by means of the voltage at the second gate electrode 8.

The embodiment described can be manufactured entirely by means of processes conventionally used in semiconductor technology. The $p$-type silicon substrate 8 may, for example, be doped with boron in a concentration of approximately $10^{18}$ atoms/cm$^3$. The $n$-type layer 3 is obtained, for example, by growing an epitaxial layer with a doping concentration of, for example $10^{15}$ to $10^{16}$ atoms/cm$^3$. After the semiconductor body has been subjected to all high-temperature treatments necessary for the manufacture, the ultimate thickness of the $n$-type layer 3 is, for example, 2 μm. The $n$-type layer may be subdivided in known manner into a number of parts which are separated from each other by means of isolation zones which may consist of $p$-type material or of insulating material but which may also be constructed, for example, from a combination of these possibilities. In the part of the semiconductor body destined for the memory matrix, isolation stripes 21 of approximately 34 μm by 10 μm are provided, for example, by local oxidation of the semiconductor body. The thickness of the resulting oxide stripes is, for example, approximately 2 μm. As is known, the oxide stripes may be provided so that they are insert in the semiconductor body substantially throughout their thickness. In that case they reach down to the substrate 8. When the depth of penetration of the oxide stripes is chosen to be smaller, $p$-type regions which extend into the substrate may be provided below the oxide stripes, for example, in the manner described in the above-mentioned U.S. Pat. No. 3,783,047. In the part of the semiconductor body destined for the memory matrix the $n$-type region 3 as a result has the shape of a continuous grating or grid which surrounds the isolation strips extending into the substrate.

The $n$-type region 3 in the form of a grating may also be obtained in a different manner. In many cases it will be preferred to first provide a $p$-type body with insulating stripes 21 and then to provide the grating-shaped $n$-type region 3 in the body by overdoping, preferably by means of ion implantation.

The surface layer of the grating-shaped $n$-type region 3 is then preferably converted into $p$-type material by ion implantation and/or diffusion. The depth of penetration of said $p$-type surface layer is, for example 0.5 to 1 μm and the surface concentration is, for example, approximately $10^{18}$ atoms/cm$^3$.

With an insulating layer, for example a silicon dioxide layer 10 having a thickness of approximately 0.1 μm, present at the surface of the semiconductor body, conductive stripes 9 which are to form the word lines are provided. The width of the strips 9, is, for example, approximately 10 μm and their mutual distance is, for example, 12 to 14 μm. The word lines may consist of a refractory metal, for example molybdenum, or also of polycrystalline silicon. The thickness of the stripes is, for example, approximately 0.5 μm.

Figure 2:
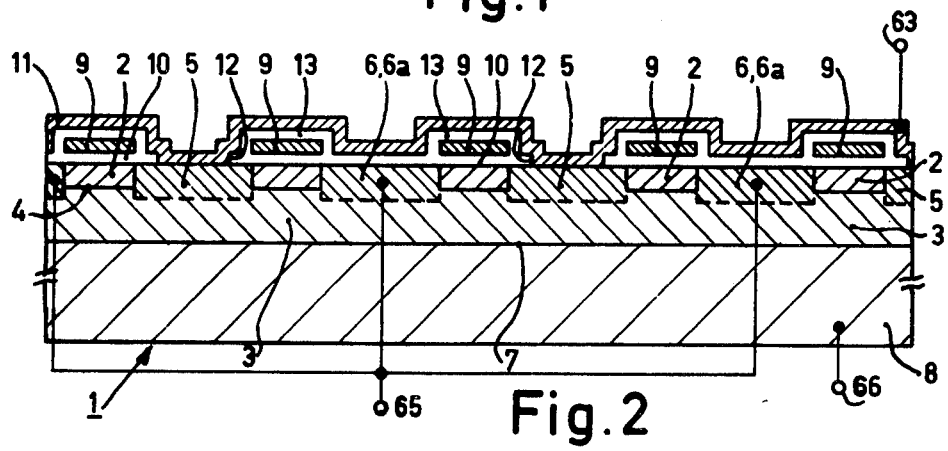
Figures 3, 4:
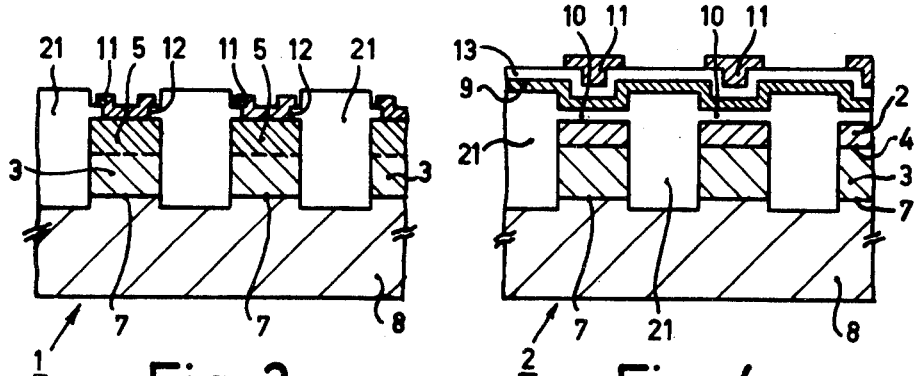

The word lines 10 may then be used as a mask in a doping treatment in which the $n$-type regions 5 and 6, 6a are obtained. If desired, first the parts of the above-mentioned oxide layer not covered by the word lines 9 may be removed. The surface concentration in the $n$-type regions 5 and 6, 6a is, for example $10^{19}$ to $10^{21}$ atoms/cm$^3$ and the depth of penetration of said regions is, for example, approximately 1.5 to 2 μm. Said depth of penetration in the present case must be larger than the thickness of the p-type surface layer but is further not critical. For example, the regions 5 and 6, 6a may extend through the surface layer 3 into the substrate region 8. In that case the pn-junction 7 between the p-type and the n-type material will not be flat, as shown in FIG. 2, but will be curved. The pn-junction follows the bulges of n-type material in the p-type substrate region formed by the regions 5 and 6, 6a.

After said doping treatment the resulting structure has p-type zones 2 which are separated from each other and which are accurately situated below the word lines 9 and are coupled capacitively thereto. The word lines are self-aligned between the source and drain electrode regions 5 and 6, 6a.

The semiconductor surface and the word lines 9 may be covered in the usual manner with an insulating layer 13 of, for example, approximately 1 μm thickness in which apertures 12 of, for example, 6 μm by 6 μm may be provided for contacting the electrode regions 5. At the same time, apertures for contacting the n-type stripes 6a may be provided in one or more suitably chosen places and, if necessary, also apertures may be provided for further contacting of the word lines 9. The contact apertures for the stripes 6a and the word lines 9 are not in the Figure and may be situated, for example, near the edge of the memory matrix.

A conductive layer of, for example, aluminium may then be provided from which the bit lines 11 can be obtained in a width of, for example, approximately 8 μm.

It will be obvious to those skilled in the art that the semiconductor device according to the invention can be manufactured with various combinations of known process steps, in which an adapted choice can be made, for example, inter alia with reference to the desired electrical specifications. In most of the cases no extra process steps will be necessary for the control logic and read-out electronics to be co-integrated in the semiconductor body. The depth of penetration of the various zones and regions and in particular the distance between pn-junctions 4 and 7, as well as the doping concentrations, and/or concentration profiles, can be adapted to the desired properties in which in particular the doping of the channel regions of the JFET structures is of influence on the matching operating voltages to be used. Notably, the doping concentration to be chosen for the substrate region 8, which concentration otherwise also has influence on the operating voltages, can be determined inter alia by requirements to be imposed upon the control electronics. For example, when the n-type region 3 is obtained by local doping, for example, the control logic may be realized in the p-type substrate 8 in MOST-technique beside the memory matrix, provided the doping concentration be sufficiently low, at least at the area of the MOS -transistors to be integrated. These and other variations can be further elaborated by those skilled in the art without departing from the scope of this invention by means of the numerous available literature reference and the above indications of depth of penetration and dopings, so that this need not be further described.

The present invention is thus not restricted to the embodiment described. For example, it may be pointed out that semiconductor materials other than silicon, for example $A_{III}$-$B_V$ compounds, may be used. Furthermore the conductivity types in the example may be interchanged, in which, of course, the operating voltages are to be adapted. Otherwise, the values given of the operating voltages are meant only by way of example and are chosen comparatively arbitrarily. The punch-through voltage may also be, for example, 5 Volts dependent on the dopings and the distance between the two gate electrodes. In that case, various other voltages values may also be chosen to be smaller, which may be advantageous in particular in larger memories.

What is claimed is:

1. A semiconductor device comprising several memory sites arranged within a semiconductor body in a matrix and each having a semiconductor zone of a first conductivity type extending in a region of the second, opposite conductivity type and forming a first semiconductor junction with said zone, said semiconductor zone serving to store information-representing charge, said stored charge being separated from the remaining part of the semiconductor body by a first depletion layer associated with said first semiconductor junction and present between the zone and the region, means forming source and drain main electrode regions of a junction field effect transistor structure, which main electrode regions are separated from each other by a channel region adjoining said first depletion layer, the resistance to current passage through the channel region between the main electrode regions of the junction field effect transistor structure being controllable by the information content of the memory site, means forming a second depletion layer, by the thickness of which said resistance between the main electrode regions can also be influenced, adjoining the channel region, and an access electrode, which is common to a number of memory sites of the matrix, coupled capacitively to the semiconductor zone and isolated therefrom by an intermediate insulating layer.

2. A semiconductor device as claimed in claim 1, characterized in that one of the main electrode regions of each field effect transistor structure of the matrix is connected to the corresponding main electrode regions of the other field effect transistor structures of the matrix.

3. A semiconductor device as claimed in claim 2, characterized in that at least the interconnected main electrode region are disposed in a common continuous semiconductor region of the second conductivity type.

4. A semiconductor device as claimed in claim 2, characterized in that the source or drain regions of a number of memory sites of the matrix are interconnected, said number of memory sites comprising only one memory site which also belongs to the said number of memory sites having a common capacitively coupled access electrode.

5. A semiconductor device as claimed in claim 4, characterized in that the drain regions of the field effect transistor structures of the matrix are interconnected, the memory sites being arranged in groups, each group having a common selection line connected to the source regions of the field effect transistor structures of the group.

6. A semiconductor device as claimed in claim 4, characterized in that a main electrode region which is common to two field effect transistor structures is situated between two access electrodes, said main electrode region being connected, via an aperture in the insulating layer, to a conductor track extending transversely to the access electrodes, said conductor track forming a selection line or bit line which is common to a number of memory sites of the matrix.

7. A semiconductor device as claimed in claim 1, characterized in that the JFET structures are integrated in a common body together with electronic control means which are coupled to the access electrodes and the selection lines, the control means comprising at least means for selectively writing and reading the memory sites.

8. A semiconductor device as claimed in claim 1, characterized in that the field effect transistor structures are provided in a common layer-shaped region of the second conductivity type which has been obtained by implantation of activators in a substrate region of the first conductivity type.

9. A semiconductor device as claimed in claim 8, characterized in that the semiconductor zones of the first conductivity type are constructed as part of a surface layer of the first conductivity type obtained in the layer-shaped region of the second conductivity type by overdoping, which parts adjoin the semiconductor surface and are separated from each other.

10. A semiconductor device as claimed in claim 1, and further including dielectric isolation means in the semiconductor body between the field effect transistor structures coupled to a common access electrode, the common access electrode extending as a substantially straight stripe across the field effect transistor structures and being situated in a self-aligned manner between the source and drain regions and above the semiconductor zones of the first conductivity type.

11. A semiconductor device as claimed in claim 10, characterized in that the common access electrodes are constructed as stripes of semiconductor material provided on the insulating layer.

12. A semiconductor device as claimed in claim 10, characterized in that isolation stripes extending transversely to the access electrodes are provided as a dielectric insulation, said insulation stripes being sunk in the semiconductor body at least over a part of their thickness.

13. A semiconductor device as claimed in claim 1, characterized in that the second depletion layer is associated with a second gate electrode, said second gate electrode being constructed so as to be common to all field effect transistor structures of the matrix.

14. A semiconductor device as claimed in claim 13, characterized in that the common second gate electrode is formed by a common substrate region of the first conductivity type extending below the channel regions of all field effect transistor structures of the matrix.

15. A semiconductor device as claimed in claim 13, and further including means for applying erasing pulses of a first polarity to selected access electrodes in which a potential is impressed upon the semiconductor zones of the first conductivity type coupled capacitively thereto, at which potential punch through occurs between said semiconductor zones and the second gate electrodes of the selected JFET structures.

16. A semiconductor device as claimed in claim 15, and further including means for connecting the second main electrode regions of the JFET structures together and to a supply voltage source at least during reading-out information.

17. A semiconductor device as claimed in claim 15, and further including means for connecting the second gate electrodes of the JFET structures together and to a voltage source so as to apply to the second gate electrodes a voltage with respect to the first main electrode regions of the JFET structures, at which voltage the channel regions are partly squeezed by the second depletion layer.

18. A semiconductor device as claimed in claim 17, and further including means for adjusting the pinch-off voltage of the channel regions of the JFET structures by means of the voltage at the second gate electrodes at a value at which the channels are cut off in the non-selected condition without causing punch-through to occur from the first gate electrodes to the second gate electrodes and in which during reading currents flow through the channel in the selected JFET structures which correspond to the stored information.

19. A semiconductor device as claimed in claim 15, and further including means for applying write pulses of a second polarity, opposite to the first polarity to selected access electrodes, and means for applying an information signal to selected selection lines connected to one or more first main electrode regions of the JFET structures, so as to cause injection of charge carriers occurring from the semiconductor zones coupled capacitively to the selected access electrode through the depletion layers bounding said semiconductor zones.

20. A semiconductor device as claimed in claim 19, and further including means for applying read pulses of the second polarity to selected access electrodes, the conductivity in the channels of the selected JFET structures being detected at the selection lines and being a measure of the stored information, the channels of the non-selected JFET structures remaining in the non-conductive state.

21. A semiconductor device as claimed in claim 20, characterized in that the voltage value of the write pulse exceeds that of the read pulse.

* * * * *